United States Patent
Mitani et al.

[11] Patent Number: 5,918,139
[45] Date of Patent: Jun. 29, 1999

[54] METHOD OF MANUFACTURING A BONDING SUBSTRATE

[75] Inventors: Kiyoshi Mitani, Takasaki; Katsuo Yoshizawa, Kosyoku, both of Japan

[73] Assignee: Shin Etsu Handotai Co., Ltd., Tokyo, Japan

[21] Appl. No.: 09/014,415

[22] Filed: Jan. 27, 1998

[30] Foreign Application Priority Data

Jan. 31, 1997 [JP] Japan .................................. 9-032790

[51] Int. Cl.⁶ ............................. H01L 21/30; H01L 21/46
[52] U.S. Cl. ......................... 438/459; 438/455; 438/612
[58] Field of Search ................................ 438/459, 612, 438/455

[56] References Cited

U.S. PATENT DOCUMENTS

| | | | |
|---|---|---|---|
| 5,403,777 | 4/1995 | Bryant et al. ........................... | 438/612 |
| 5,665,631 | 9/1997 | Lee et al. ............................... | 438/459 |
| 5,668,045 | 9/1997 | Golland et al. ........................ | 438/459 |
| 5,693,567 | 12/1997 | Weisfield et al. ..................... | 438/612 |

FOREIGN PATENT DOCUMENTS

| | | | |
|---|---|---|---|
| 60-50970 | 3/1985 | Japan ............................ | H01L 29/84 |
| 189346 | 4/1989 | Japan ............................ | H01L 21/94 |
| 389519 | 4/1991 | Japan ............................ | H01L 21/306 |
| 3250616 | 11/1991 | Japan ............................ | H01L 21/02 |
| 4263425 | 9/1992 | Japan ............................ | H01L 21/304 |
| 5160074 | 6/1993 | Japan ............................ | H01L 21/302 |
| 7045485 | 2/1995 | Japan ............................ | H01L 21/02 |

*Primary Examiner*—Kevin M. Picardat
*Assistant Examiner*—Deven Collins
*Attorney, Agent, or Firm*—Loeb & Loeb LLP

[57] ABSTRACT

A method of manufacturing a bonding substrate is disclosed. An oxide film is formed on the surface of at least one of two semiconductor substrates, and the two substrates are brought into close contact with each other via the oxide film. The substrates are heat-treated in an oxidizing atmosphere in order to firmly join the substrates together. Subsequently, an unjoined portion at the periphery of a device-fabricating substrate is completely removed, and the thickness of the device-fabricating substrate is reduced to a desired thickness so as to yield a thin film. The surface of the thin film is then etched through vapor-phase etching in order to make the thickness of the thin film uniform. In the method, the oxide film on the unjoined portion of at least the support substrate is removed before the surface of the thin film is subjected to vapor-phase etching. The method prevents a groove from being formed in the surface of the unjoined portion (terrace portion) of the support substrate (base wafer) even when the surface of the thin film undergoes vapor phase etching.

7 Claims, 2 Drawing Sheets

FIG. 1A
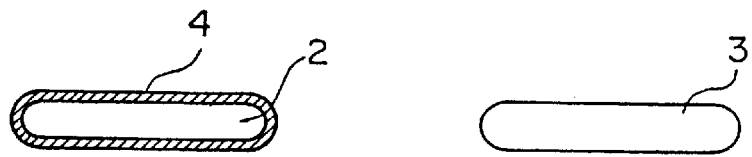
FIG. 1B
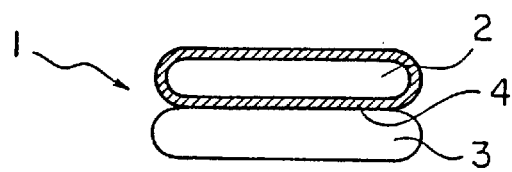
FIG. 1C
FIG. 1D
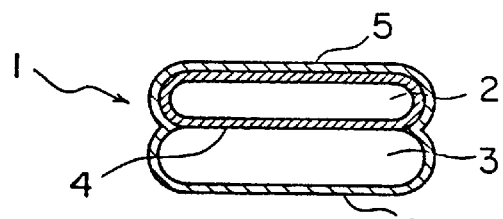
FIG. 1E
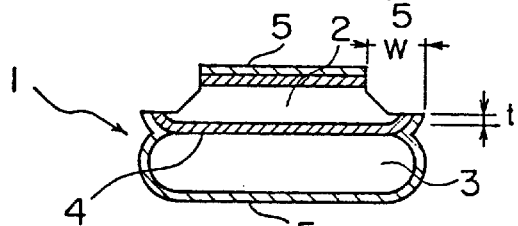
FIG. 1F
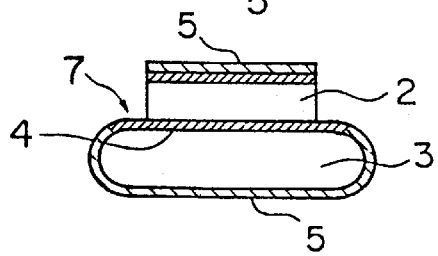
FIG. 1G
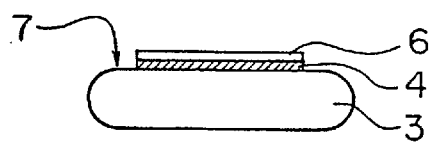
FIG. 1H
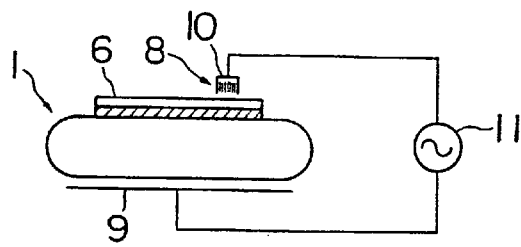

METHOD OF MANUFACTURING A BONDING SUBSTRATE

BACKGROUND OF THE INVENTION

1. Field of the Invention

The present invention relates to a method of manufacturing a bonding substrate composed of two semiconductor substrates bonded together, and more particularly to a method of manufacturing a so-called bonding SOI (Silicon on Insulator) substrate in which two silicon monocrystalline substrates are bonded together via a silicon oxide film.

2. Description of the Related Art

There have been known various methods of manufacturing a bonding SOI substrate in which two silicon monocrystalline substrates are bonded together via a silicon oxide film. In the method shown, for example, in Japanese Patent Publication (kokoku) 5-46086, an oxide film is formed on at least one of two substrates; the two substrates are brought into close contact with each other with no foreign substance being interposed between the joint surfaces thereof; and the substrates are then subjected to heat treatment at a temperature of about 200° to 1200° C. in order to increase bonding strength.

Since a bonding substrate whose joint strength has been increased by means of heat treatment can undergo a subsequent grinding and polishing process, the thickness of one substrate on which devices are to be fabricated can be reduced to a desired thickness through grinding or polishing in order to obtain an SOI layer for formation of semiconductor elements.

However, it is known that a bonding substrate manufactured in the above-described manner has an unjoined portion in an area extending about 1–3 mm from the peripheral edge of the substrate. In order to remove such an unjoined portion, there have been developed various techniques such as those shown in Japanese Patent Application Laid-Open (kokai) Nos. 3-89519 and 4-263425.

Although these methods can remove such an unjoined portion, in subsequent processes resultant substrates cannot be handled in the same manner as ordinary wafers. That is, since the peripheral portion of one substrate on which devices are to be fabricated (bond wafer) is ground to reach the other substrate which serves as a support substrate (base wafer), the shape of the base wafer changes greatly from the original shape, making it difficult to handle the resultant wafer in the same manner as used for ordinary wafers.

There have also been proposed methods of manufacturing a bonding SOI substrate that do not involve the above-described problem, such as those described in Japanese Patent Application Laid-Open (kokai) Nos. 3-250616 and 64-89346. In the method disclosed in Japanese Patent Application Laid-Open No. 3-250616, a piece of masking tape is applied to a wafer to cover the entire wafer except the peripheral portion, and then etching is performed in order to remove the unjoined portion at the periphery of the wafer. In the method disclosed in Japanese Patent Application Laid-Open No. 64-89346, the entire peripheral portion of a bonded wafer is removed through etching.

Further, Japanese Patent Application Laid-Open (kokai) No. 7-45485 discloses another method of manufacturing a boding substrate. In this method, the peripheral portion of a bonding wafer is removed through grinding to a degree such that damage does not reach the base wafer; the unjoined portion at the periphery of the bonding wafer is then completely removed through etching; and the bonding wafer is ground and/or polished to yield a thin film having a desired thickness.

The above-described methods can remove an unjoined portion of a bonding wafer without changing the shape of the base wafer.

Meanwhile, accompanying a recent increase in the degree of integration and speed of semiconductor devices, demand exists to further reduce the thickness of an SOI layer. Recently, there has arisen demand for an ultra-thin SOI layer having a thickness of 1 μm or less. Accordingly, in order to manufacture a bonding substrate having such an ultra-thin SOI layer, the bond wafer must be machined to a thickness of 0.1 micron or less with accuracy of at least ±0.01 micron.

In order to realize accurate film machining to 0.1± 0.01 micron, there has been developed a technique, a so-called PACE (plasma assisted chemical etching) method, as disclosed in Japanese Patent Application Laid-Open (kokai) No. 5-160074. The PACE method is a method for making the thickness of a thin film uniform through vapor-phase etching. In this method, thickness distribution of a silicon layer to be made uniform is measured in order to create a map of the thickness distribution, and a thicker portion is locally removed through vapor-phase etching that is numerically controlled in accordance with the map. This method enables manufacture of an ultra-thin film having a highly uniform thickness.

However, in a method of manufacturing a bonding substrate having a step of removing an unjoined portion, if the surface of a thin film is subjected to vapor-phase etching in order to yield an ultra-thin SOI layer having a highly uniform thickness, a groove, trench, depression, or the like (hereinafter generically referred to as a "groove") is formed in the surface of an unjoined portion of a support substrate (base wafer). The groove allows photo resist to remain in a subsequent device process or causes improper focusing in an exposure process.

SUMMARY OF THE INVENTION

The present invention has been accomplished to solve the above-mentioned problems, and an object of the invention is to provide a method of manufacturing a bonding substrate having a step of removing an unjoined portion, which method prevents formation of a groove in the surface of the unjoined portion (terrace portion) of a support substrate (base wafer) even when the surface of a thin film undergoes vapor phase etching.

To achieve the above object, the present invention provides a method of manufacturing a bonding substrate, the method comprising the steps of forming an oxide film on the surface of at least one of two semiconductor substrates; bringing the two substrates into close contact with each other via the oxide film; heat-treating the substrates in an oxidizing atmosphere in order to firmly join the substrates together; completely removing an unjoined portion at the periphery of a substrate on which a device is to be fabricated (hereinafter referred to as the "device-fabricating substrate); reducing the thickness of the device-fabricating substrate to a desired thickness so as to yield a thin film; and etching the surface of the thin film through vapor-phase etching in order to make the thickness of the thin film uniform, wherein the oxide film on the unjoined portion of at least the support substrate is removed before the surface of the thin film is subjected to vapor-phase etching.

When the oxide film on the unjoined portion of at least the support substrate is removed before the surface of the thin film is subjected to vapor-phase etching, the oxide film on the unjoined portion (terrace portion) is uniformly removed by means of vapor-phase etching. Therefore, there can be prevented generation of a groove stemming from nonuniform thickness of the oxide film.

The step of removing an unjoined portion at the periphery of the device-fabricating substrate may be performed such that the peripheral portion of the device-fabricating substrate is ground to a predetermined depth, and the unjoined portion at the periphery of the device-fabricating substrate is completely removed through subsequent etching.

Alternatively, the removal step may be performed such that the entire device-fabricating substrate is masked except the peripheral portion thereof, and the unjoined portion at the periphery of the device-fabricating substrate is completely removed through subsequent etching.

Further, the removal step may be performed such that the peripheral portion of the device-fabricating substrate is ground, the entire ground surface is masked except the peripheral portion thereof, and the unjoined portion at the periphery of the device-fabricating substrate is completely removed through subsequent etching.

As described above, in the method having a step of removing an unjoined portion at the periphery of the device-fabricating substrate without changing the shape of the support substrate, an oxide film having a nonuniform thickness remains on the terrace portion of the support substrate, so that a groove is formed at the terrace portion. The method of the present invention can effectively prevent formation of such a groove at the terrace portion.

In this case, etching performed in the step of removing an unjoined portion at the periphery of the device-fabricating substrate is preferably alkali etching. Removal of the unjoined portion through alkali etching prevents partial removal of the nonuniform oxide film on the support substrate, because alkali etching has a large degree of etching rate selectivity. Therefore, alkali etching is preferred in terms of effective prevention of formation of a groove.

In the present invention, since the surface of the thin film is subjected to vapor-phase etching after removal of an oxide film on an unjoined portion of the support substrate, the terrace portion is etched uniformly, so that no groove is formed at the terrace portion.

Therefore, there can be solved the problems that photo resist enters and remains in a groove in a subsequent device fabrication process and that focusing in an exposure process becomes improper.

BRIEF DESCRIPTION OF THE DRAWING

FIGS. 1A–1H are diagrams illustrating a general process for manufacturing a bonding substrate according to the present invention.

DESCRIPTION OF THE PREFERRED EMBODIMENT

Figure 2A:
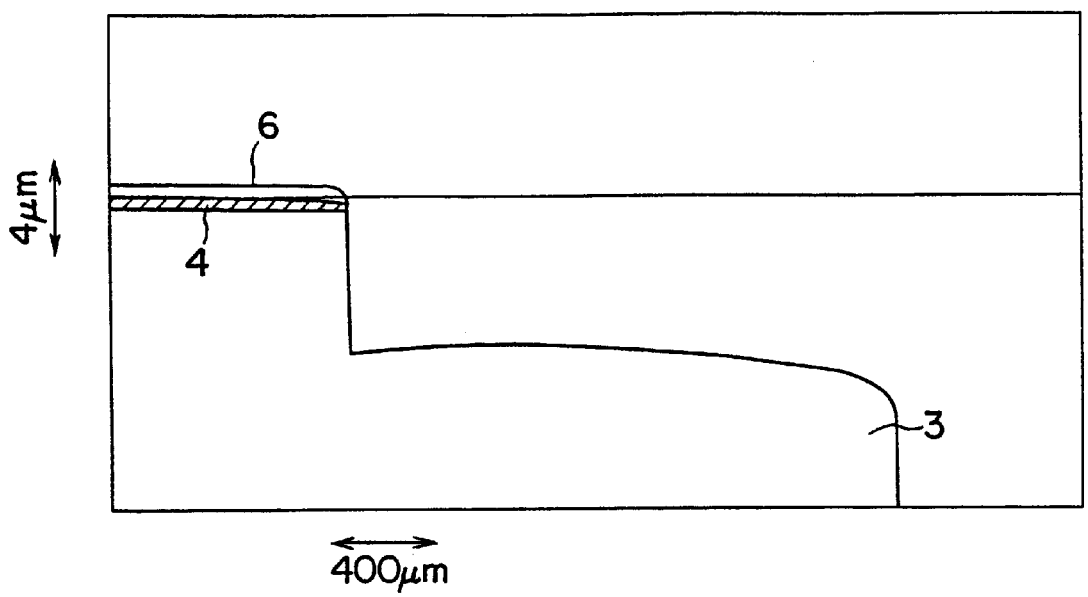
FIG. 2A is a plot showing the measured profile of a terrace portion after vapor-phase etching in Example.

With reference to the drawing, an embodiment of the present invention will next be described for a case where the step of removing an unjoined portion at the periphery of the device-fabricating substrate is performed such that the peripheral portion of the device-fabricating substrate is ground to a predetermined depth, and the unjoined portion at the periphery of the device-fabricating substrate is completely removed through subsequent etching. However, the present invention is not limited thereto.

FIGS. 1A–1H show a general process for manufacturing a bonding substrate according to the present invention.

The inventors of the present invention studied the phenomenon that when the surface of a thin film is subjected to vapor-phase etching in order to obtain an ultra-thin SOI layer having a uniform thickness in the method of manufacturing a bonding substrate having a step of removing an unjoined portion, a groove is formed in the surface of the unjoined portion of a support substrate (base wafer). As a result, the inventors found that the phenomenon occurs because the thickness of an oxide film in a region in which the unjoined portion exists is nonuniform and increases toward the periphery of the substrate. The present invention was accomplished based on this finding.

The method according to the present invention will now be described step by step. First, material wafers (monocrystalline silicon mirror-polished wafers, for example, having a diameter of 6 inches (150 mm) and a <100> orientation, which are manufactured in accordance with the Czochralski method) are prepared as a bond wafer 2 and a base wafer 3 (FIG. 1A). Among the prepared silicon monocrystalline wafers, the bond wafer 2 is heat-treated to form an oxide film 4 on the surface thereof (FIG. 1B).

Subsequently, the bond wafer 2 carrying the oxide film 4 is brought into close contact with the base wafer 3 in a clean atmosphere (FIG. 1C). The bond wafer 2 and the base wafer 3 are then heat-treated in an oxidizing atmosphere in order to firmly join the bond wafer 2 and the base wafer 3 so as to yield a bonding substrate 1. The heat treatment is performed at a temperature of 200°–1200° C. in an atmosphere that contains oxygen or water vapor (FIG. 1D).

At this time, the bond wafer 2 and the base wafer 3 are firmly joined together, and an oxide film 5 is formed on the entire outer surface of the bonding substrate 1. The oxide film 5 serves as an etching prevention film in a subsequent step. In this joining step, the base wafer is mainly oxidized, but the thickness of the buried oxide layer 4 does not change. Therefore, at the periphery portion of the bonding substrate 1, the oxide film has a thickness profile such that the thickness of the oxide film is substantially the same as that of the buried oxide layer in a region extending between a distance of 1.5 mm to a distance of 3 mm away from the peripheral edge of the bonding substrate 1, and outside this region, the thickness of the oxide film drastically increases toward the peripheral edge of the wafer.

In an area extending about 2 mm from the peripheral edge of the bonding substrate 1, the bond wafer 2 and the base wafer 3 have an unjoined portion. The unjoined portion must be removed because such an unjoined portion cannot be used as an SOI layer for fabrication of semiconductor devices, and may peel off in a subsequent process and may cause various problems.

In order to remove the unjoined portion, as shown in FIG. 1E, the peripheral portion of the bond wafer 2 where the unjoined portion exists is ground over a width w such that the thickness of the unjoined portion decreases to a predetermined thickness t. The grinding operation can remove the unjoined portion with high speed and high accuracy.

In this case, the predetermined thickness t is preferably made as small as possible in order to reduce the stock removal to be removed in an etching step, which is subsequent to the unjoined portion removal step.

It is well known that when a silicon wafer is mechanically ground, mechanical damage is generated in the wafer, unlike the case of etching. Therefore, if the predetermined thickness t is reduced excessively, damage such as mechanical damage reaches the buried oxide layer 4 or the base wafer 3. In this case, when the unjoined portion at the periphery of the bond wafer 2 is completely removed by subsequent etching, etchant may reach the surface of the base wafer 3 via the damaged buried oxide layer 4 and form a scratch or depression in the surface, so that the yield in the subsequent device step decreases. Accordingly, the grinding at the peripheral portion is restricted to a depth such that damage does not reach the buried oxide layer 4 or the base wafer 3.

Subsequently, as shown in FIG. 1F, the unjoined portion at the periphery of the bond wafer 2 is completely removed through etching. This etching can be performed through immersion of the bonding wafer 1 into an etchant whose etching speed for silicon monocrystal is greatly higher than that for oxide film. That is, although the peripheral portion of the bond wafer 2 is etched by the etchant because the silicon has been exposed through grinding, the remaining portions of the bonding substrate 1 are not etched because these portions are covered by the oxide film 5 and the buried oxide layer 4.

In the present invention, since the thickness of the peripheral portion of the bond wafer 2 is sufficiently reduced, the unjoined portion existing at the periphery of the bonding substrate 1 can be completely removed through etching over a short period of time.

An example of etching that exhibits selectivity include etching utilizing $HF+HNO_3$, KOH, NaOH, or the like. However, alkali etching utilizing KOH, NaOH, or the like and exhibiting a large selectivity is preferred.

This is because when an etchant including HF and $HNO_3$ is used, the ratio of the etching speed for Si to the etching speed for $SiO_2$ ($Si/SiO_2$ etching speed ratio) is as high as 10, which is lower than the etching speed ratio (more than 100) in the case of alkali etching. Further, in order to completely remove the unjoined portion at the periphery of the bond wafer, the etching is performed slightly excessively, so that the thickness of the unjoined portion becomes slightly less than the predetermined thickness t, and the oxide film is also etched to some degree. Therefore, if an etchant having a low degree of selectivity is used, the thickness of the etched portion of the oxide film increases, with the result that the oxide film formed on the unjoined portion (terrace portion 7) of the base wafer 3 and having a nonuniform thickness is completely dissolved away in an area extending between a distance of 1.5 mm to a distance of 3 mm away from the peripheral edge of the base wafer 3, because the thickness of the oxide film in that area is smaller than that in the portion outside that area. Thus, the underlying silicon is etched. In the area extending to 1.5 mm from the peripheral edge of the wafer, since the thickness of the oxide film is large, the oxide film remains. Since the remaining oxide film serves as a mask, a groove may be formed in the surface of the base wafer 3 in the area extending between a distance of 1.5 mm to a distance of 3 mm away from the peripheral edge of the base wafer 3, whether or not vapor-phase etching is performed.

Especially, during the manufacture of a recently demanded ultra-thin SOI layer having a thickness as thin as 1 micron or an even smaller thickness of 0.1–0.2 micron, the buried oxide layer is also required to have a very small thickness of 0.1–0.2 micron, which is a strong trend. Accordingly, alkali etching is preferably used.

Subsequently, as shown in FIG. 1G, the surface of the bond wafer 2 is ground and/or polished in order to reduce the thickness of the bond wafer 2 to a desired thickness, and the oxide film of the base wafer 3 is removed through etching. The etching for removal of the oxide film is performed through, for example, immersion of the bonding substrate into 50% hydrofluoric acid for 3 to 4 minutes.

Finally, as shown in FIG. 1H, the surface of an SOI layer 6 is subjected to vapor-phase etching in order to make uniform the thickness of the SOI layer 6. For the vapor-phase etching, there is preferably used, for example, the PACE method in which vapor-phase etching is carried out in a state in which high-frequency plasma is generated locally within a chamber 8.

The PACE method is a dry etching method. First, distribution in thickness of the SOI layer 6 on the bonding substrate 1 is measured. The traveling speed of the chamber 8 is controlled according to the measured thickness distribution of the SOI layer 6 on the bonding substrate 1. As a result, the period of time within which each portion of the SOI layer 6 is exposed to the plasma within the chamber 8; i.e., the etching stock removal at each portion of the SOI layer 6, is controlled in order to make uniform the thickness of the SOI layer 6 on the bonding substrate 1. The plasma is generated locally within the chamber 8 through use of electrodes 9 and 10, which are disposed below and above the bonding substrate 1 and between which high-frequency power is applied from a high-frequency power source 11. The chamber 8 is designed such that it can freely travel over the bonding wafer 1.

Thus, the bonding substrate having the ultra-thin SOI layer 6 can be manufactured. The reason why the oxide film of the base wafer is etched and removed before the vapor-phase etching is that the $Si/SiO_2$ etching speed ratio of the vapor-phase etching is not very high (about 10 to 15), which means that the selectivity of the vapor-phase etching is not very high.

If the base wafer 3 undergoes the vapor-phase etching in a state in which a nonuniform oxide film exists on the terrace portion 7 of the base wafer 3, the oxide film on the base wafer 3 is exposed to the plasma because the oxide film is uncovered. Therefore, the oxide film on the unjoined portion (terrace portion) of the base wafer is also etched to some degree.

Accordingly, by means of vapor-phase etching that has a low degree of selectivity, like the above-described etching for completely removing the unjoined portion at the periphery of the bond wafer, the oxide film is etched in a large amount, so that the oxide film formed on the unjoined portion of the base wafer 3 and having a nonuniform thickness is etched and completely removed in a region extending between a distance of 1.5 mm to a distance of 3 mm away from the peripheral edge of the base wafer 3, because the thickness of the oxide film in that area is smaller than that in the portion outside that area. Thus, the underlying silicon is etched. In the area extending from the peripheral edge of the wafer to a distance of 1.5 mm therefrom, since the thickness of the oxide film is large, the oxide film remains. Since the remaining oxide film serves as a mask, during the step of vapor-phase etching a groove is formed in the surface of the base wafer 3 in the area extending between a distance of 1.5 mm to a distance of 3 mm away from the peripheral edge of the base wafer 3. Especially, during the manufacture of a recently demanded ultra-thin SOI layer having a thickness as thin as 1 micron or an even smaller thickness of 0.1–0.2 micron, the buried oxide layer is also required to have a very small thickness of 0.1–0.2 micron. In such a case, the oxide film is completely removed at an early stage of the vapor-phase etching process, so that a deeper groove is formed.

Therefore, if the oxide film on the surface of the base wafer 3 is removed through etching before the vapor-phase etching, the unjoined portion of the base wafer 3 is uniformly removed by the vapor-phase etching without being effected by the masking effect of the oxide film having a nonuniform thickness, so that a groove is prevented from being formed at that portion.

A sufficient result is obtained when the oxide film on the base wafer 3 is removed from only the unjoined portion (terrace portion 7) of the base wafer 3. Therefore, the oxide film is not required to be removed from the entire surface of the base wafer 3.

When the oxide film on the base wafer 3 is removed before the vapor-phase etching, the unjoined portion of the base wafer 3 is slightly removed through etching. However, since the amount of the silicon removed by the vapor-phase etching is as low as 5 microns and the surface does not have a groove or the like and is therefore uniform, such a reduction in thickness does not cause a problem in subsequent steps.

EXAMPLES

Next, descriptions will be given of an example of the present invention and a comparative example.

Example and Comparative Example 20 mirror-polished CZ substrates having a diameter of 150 mm (6 inches) and a thickness of 625 microns (conductive type: p type; resistivity: 10–20 Ω108 cm) were prepared and divided into 10 bond wafers and 10 base wafers. These wafers were joined in accordance with the processes shown in FIGS. 1A–1D in order to yield 10 bonding substrates as shown in FIG. 1D. The thickness of the oxide film of the bond wafer which defined the thickness of a buried oxide layer was set to 300 nm.

According to the processes shown in FIGS. 1E and 1F, the periphery of each substrate was ground to be removed, and was subjected to alkali etching utilizing 25% NaOH in order to completely remove the unjoined portion at the periphery of the substrate.

Subsequently, grinding and/or polishing, which are usually performed for a bonding wafer, were performed in order to manufacture bonding substrates each having an SOI layer of 4.3 microns thick.

The profile of the terrace portion of each bonding wafer whose bond wafer had been thinned to a desired thickness through removal of the unjoined portion at the periphery of the bond wafer was measured by a surface roughness measuring apparatus SV-600 (trade name, product of Mitutoyo Corporation).

The results show that whereas the buried oxide layer had a thickness of 300 nm, the oxide film remaining at the terrace portion had a thickness of 200–300 nm and a thickness profile such that the thickness increased toward the peripheral edge. Also, it was confirmed that no groove was formed in the terrace portion at this point.

Five of the thus-manufactured SOI substrates were subjected as they were to vapor-phase etching in order to remove the bond wafer in a thickness of about 4 microns from the surface, thereby making the thickness of the SOI layer uniform (Comparative Example). Meanwhile, the remaining five SOI substrates were first immersed into a solution of 50% HF in order to remove the oxide film from the base wafer, and then subjected to vapor-phase etching in order to remove the bond wafer in a thickness of about 4 microns from the surface (Example).

Figure 2B:
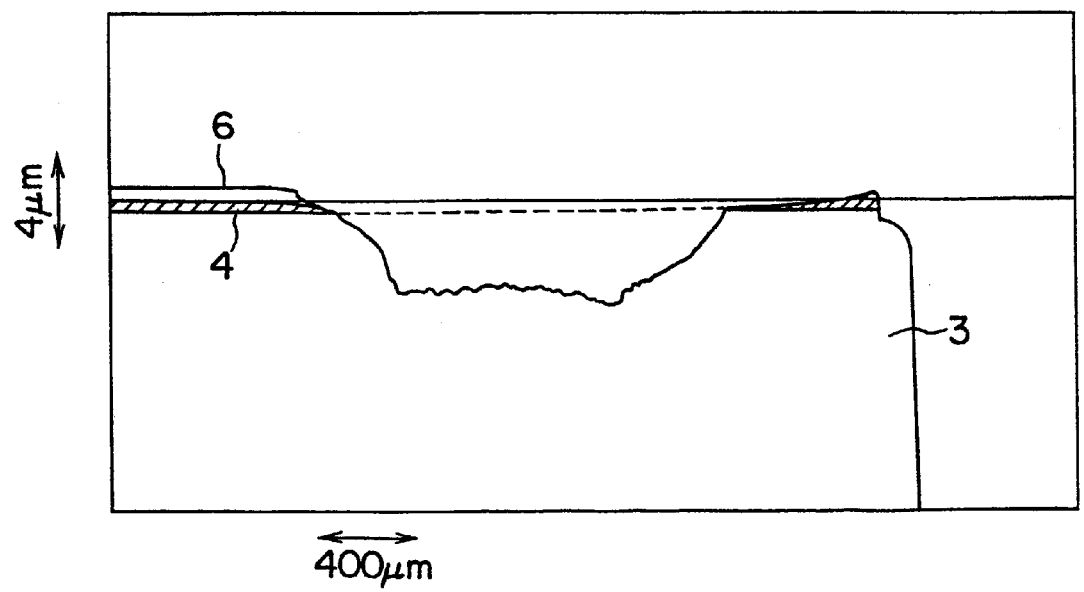
FIG. 2B is a plot showing the measured profile of a terrace portion after vapor-phase etching in Comparative Example.

The profile of the terrace portion of each bonding substrate that had undergone the above-described process was measured again by the surface roughness measuring apparatus SV-600 (trade name, product of Mitutoyo Corporation). The results are shown in FIGS. 2A and 2B, wherein FIG. 2A shows the Example, while FIG. 2B shows the Comparative Example.

The results show that in the Comparative Example in which vapor-phase etching was performed without removal of the oxide film of the base wafer, a groove having a depth of about 4–6 microns was formed in the area extending between a distance of 1.5 mm to a distance of 3 mm away from the peripheral edge of the base wafer and that in the Example in which vapor-phase etching was performed after removal of the oxide film from the base wafer, no groove was formed at the terrace portion and the bond wafer was uniformly etched by about 4 microns.

The present invention is not limited to the above-described embodiment. The above-described embodiment is a mere example, and those having the substantially same structure as that described in the appended claims and providing the similar action and effects are included in the scope of the present invention.

The above-described embodiment of the present invention is directed to the case where the step of removing an unjoined portion at the periphery of the device-fabricating substrate is performed such that the peripheral portion of the device-fabricating substrate is ground to a predetermined depth, and the unjoined portion at the periphery of the device-fabricating substrate is completely removed through subsequent etching. However, the present invention is not limited thereto and can be applied to the case where the removal step is performed such that the entire device-fabricating substrate is masked except the peripheral portion thereof, and the unjoined portion at the periphery of the device-fabricating substrate is completely removed through subsequent etching, as well as to the case where the removal step is performed such that the peripheral portion of the device-fabricating substrate is ground, the entire ground surface is masked except the peripheral portion thereof, and the unjoined portion at the periphery of the device-fabricating substrate is completely removed through subsequent etching.

That is, the present invention can be applied, in principle, to any process, insofar as the process has a problem that a groove is formed at the terrace portion during the step of making a thin film uniform through vapor-phase etching.

What is claimed is:

1. A method of manufacturing a bonding substrate comprising the steps of:

forming an oxide film on the surface of at least one of two semiconductor substrates;

bringing the two semiconductor substrates into close contact with each other via the oxide film;

heat-treating the substrates in an oxidizing atmosphere in order to firmly join the substrates together;

completely removing an unjoined portion at the periphery of a device-fabricating substrate;

reducing the thickness of the device-fabricating substrate to a desired thickness so as to yield a thin film;

removing the oxide film on the unjoined portion of at least the support substrate; and etching the surface of the thin film through vapor-phase etching to make the thickness of the thin film uniform, the etching performed after removing the oxide film.

2. A method of manufacturing a bonding substrate according to claim 1, wherein said step of removing an unjoined portion at the periphery of the device-fabricating substrate is performed such that the periphery of the device-fabricating substrate is ground to a first depth, and the unjoined portion at the periphery of the device-fabricating substrate is completely removed through subsequent etching.

3. A method of manufacturing a bonding substrate according to claim 1, wherein said step of removing an unjoined portion at the periphery of the device-fabricating substrate is performed such that the entire device-fabricating substrate is masked except the periphery thereof, and the unjoined portion at the periphery of the device-fabricating substrate is completely removed through subsequent etching.

4. A method of manufacturing a bonding substrate according to claim 1, wherein said step of removing an unjoined portion at the periphery of the device-fabricating substrate is performed such that the periphery of the device-fabricating substrate is ground, the entire ground surface is masked except the periphery thereof, and the unjoined portion at the periphery of the device-fabricating substrate is completely removed through subsequent etching.

5. A method of manufacturing a bonding substrate according to claim 2, wherein said etching performed in the step of removing an unjoined portion at the periphery of the device-fabricating substrate is alkali etching.

6. A method of manufacturing a bonding substrate according to claim 3, wherein said etching performed in the step of removing an unjoined portion at the periphery of the device-fabricating substrate is alkali etching.

7. A method of manufacturing a bonding substrate according to claim 4, wherein said etching performed in the step of removing an unjoined portion at the periphery of the device-fabricating substrate is alkali etching.

* * * * *